United States Patent
Romero et al.

(10) Patent No.: US 7,605,647 B1
(45) Date of Patent: Oct. 20, 2009

(54) CHOPPER-STABILIZED AMPLIFIER AND MAGNETIC FIELD SENSOR

(75) Inventors: Hernan D. Romero, Vte. Lopez (AR); Gerardo Monreal, Pilar (AR)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 12/111,554

(22) Filed: Apr. 29, 2008

(51) Int. Cl.
*H03F 1/02* (2006.01)
(52) U.S. Cl. .............................................. 330/9; 330/6
(58) Field of Classification Search ...................... 330/6, 330/9; 327/124, 307
See application file for complete search history.

(56) References Cited

U.S. PATENT DOCUMENTS

| | | | | |
|---|---|---|---|---|
| 6,734,723 | B2 * | 5/2004 | Huijsing et al. | 330/9 |
| 7,068,198 | B2 * | 6/2006 | Hong et al. | 341/143 |
| 7,132,883 | B2 * | 11/2006 | Huijsing et al. | 330/9 |
| 7,262,654 | B2 * | 8/2007 | Kejariwal et al. | 330/9 |
| 7,292,095 | B2 * | 11/2007 | Burt et al. | 330/9 |
| 7,425,821 | B2 | 9/2008 | Monreal et al. | |
| 7,518,440 | B1 * | 4/2009 | Trifonov | 330/9 |

FOREIGN PATENT DOCUMENTS

WO WO 02/003087 A1 1/2002

OTHER PUBLICATIONS

Bilotti et al.; "Chopper-Stabilized Amplifiers with a Track-and-Hold Signal Demodulator;" IEEE Transactions on Circuits and System—1: Fundamental Theory and Applications; vol. 46, No. 4; Apr. 1999, pp. 490-495.
Bilotti et al.; "Monolithic Magnetic Hall Sensor Using Dynamic Quadrature Offset Cancellation;" IEEE Journal of Solid-State Circuits; vol. 32, No. 6; Jun. 1997; pp. 829-836.
Bakker et al.; "A CMOS Nested-Chopper Instrumentation Amplifier with 100-nV Offset;" IEEE Journal of Solid-State Circuits; vol. 35, No. 12; Dec. 2000; pp. 1877-1883.
PCT Search Report of the ISA for PCT/US2007/014667 dated Jan. 23, 2008.
PCT Written Opinion of the ISA for PCT/US2007/014667 dated Jan. 23, 2008.
File downloaded from PAIR for U.S. Appl. No. 11/550,849, filed Oct. 19, 2006; issued as U.S. Patent No. 7425821 on Sep. 16, 2008, file through Dec. 30, 2008, 284 pages.
Motz et al. "A Chopped Hall Sensor with Small Jitter and Programmable "True Power-On" Function;" IEEE Journal of Solid-State Circuits, vol. 40, No. 7; Jul. 2005; pp. 1533-1540.

(Continued)

*Primary Examiner*—Henry K Choe
(74) *Attorney, Agent, or Firm*—Daly, Crowley, Mofford & Durkee, LLP

(57) ABSTRACT

A chopper-stabilized amplifier has switching networks arranged to support a high frequency clocking signal and to provide a high common mode rejection and a high rejection of an offset component of an input signal. A magnetic field sensor includes a Hall effect element coupled to a modulation circuit. The modulation circuit provides a signal to the chopper-stabilized amplifier. The chopper-stabilized amplifier provides an output signal to a low pass filter, which provides an output signal from the magnetic field sensor.

23 Claims, 10 Drawing Sheets

OTHER PUBLICATIONS

Munter; "A Low-offset Spinning-current Hall Plate" Elsevier Sequoia; Sensors and Actuators; A25-A27; 1990; pp. 743-746.

Munter; "Electronic Circuitry for a Smart Spinning-current Hall Plate with Low Offset;" Elsevier Sequoia; Sensors and Actuators A; 1991; pp. 747-741.

Ruther et al; "Thermomagnetic Residual Offset in Integrated Hall Plates;" IEEE Sensors Journal; vol. 3, No. 6; Dec. 2003; pp. 693-699.

Steiner et al; "Offset reduction in Hall devices by continuous spinning current method;" Elsevier, Sensors and Actuators; A66; 1998; pp. 167-172.

Thoth et al.; "Generalized Chopper Stabilization;" The 2001 IEEE International Synposium on Circuits and Systems; vol. 1; May 6, 2001; pp. 540-543.

Udo; "Limits of offset cancellation by the principle of spinning current Hall probe;" IEEE Sensors, Vienna Austria; 2004; ISBN 0-7803-8692-2; pp. 1117-1120.

ver der Meer et al. "CMOS quad spinning-current Hall-sensor system for compass application;" Proceedings of IEEE Sensors; vol. 3; Oct. 24, 2004; ISBN 0-7803-8692-2; pp. 1434-1437.

PCT International Search Report and Written Opinion of the iSA for PCT/US2009/041873 dated Jul. 3, 2009.

* cited by examiner

CHOPPER-STABILIZED AMPLIFIER AND MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to chopper-stabilized amplifiers and to magnetic field sensors that use chopper-stabilized amplifiers and, more particularly, to a chopper-stabilized amplifier that can reduce an offset component of an input signal and provide improved common mode rejection while supporting a relatively high switching frequency, and to a magnetic field sensor that uses such a type of chopper-stabilized amplifier.

BACKGROUND OF THE INVENTION

As is known, some types of analog electronic signals include both a signal component and an offset component. The offset component is usually an undesirable DC component, while the signal component can be an AC component that usually carries information used by an electronic system that receives the electronic signal. It will be recognized that, if such an electronic signal is received by and amplified by an amplifier, the amplified offset component might saturate the amplifier or cause other undesirable effects upon the electronic system receiving the electronic signal. Also, an amplifier itself has an input offset voltage, which, if greatly amplified, can saturate the amplifier or another amplifier or cause undesirable effects upon the system.

Chopper-stabilized amplifiers are used to reduce the effects of offset components of signals. Some chopper-stabilized amplifiers receive an input signal having a signal component and an offset component and operate to reduce the offset component relative to the signal component. Chopper-stabilized amplifiers having a variety of configurations are known.

Magnetic field sensors are used in a wide variety of applications. As one example, magnetic field sensors are widely used in automobiles for mechanical position sensing. For example, one type of magnetic field sensor is used as a rotation sensor in antilock brake systems.

Some types of magnetic field sensors use a Hall effect element, sometimes referred to as a Hall plate. A Hall effect element can generate a signal with both a signal component and an offset component, which can be due to resistance gradients, geometrical asymmetries, and piezoresistive effects. The magnitude and polarity of the offset component (or offset voltage) can be related to stresses in a semiconductor substrate supporting the Hall effect element, which stresses tend to vary with mechanical pressure and with temperature. Various techniques have been used to address and cancel the Hall effect element offset voltage, including use of a chopper-stabilized amplifier in combination with a current spinning technique, which is described more fully below.

One type of Hall effect sensor includes a switched Hall element, a chopper-stabilized amplifier, and a low pass filter. The switched Hall element, sometimes referred to as a spinning Hall element, includes both a Hall element having (typically) four contacts and a modulation circuit to periodically connect a supply voltage and an amplifier input to one pair of contacts or the other. Quadrature phases of operation are provided by complementary (180 degree out of phase) clock signals. Operation of a switched Hall element is described more fully below in conjunction with FIGS. 2-3C.

Use of a switched Hall element provides a way to discriminate (and relatively reduce) the Hall effect element offset voltage (referred to herein as an offset component) from the magnetically induced signal (referred to herein as a magnetic field signal component). In one type of modulation circuit used in a switched Halle element circuit, the modulation circuit modulates the magnetic signal component and the offset component remains substantially unchanged, i.e., unmodulated. In conjunction with this modulation circuit, a chopper-stabilized amplifier demodulates the magnetic signal component and modulates the offset component. The offset component, which, after the chopper-stabilized amplifier is an AC signal, is attenuated by a low pass filter to provide the magnetic field sensor output signal without an offset component. The technique effectively removes the Hall effect element offset voltage.

It will be appreciated that it is desirable to make a switching frequency used in the chopper-stabilized amplifier as high as possible. A higher switching frequency tends to result in an ability to use a low pass filter with a wider passband, which further tends to result in the magnetic field sensor having a faster response time.

It will also be understood that the magnitude of any ripple remaining on the magnetic field sensor output signal must be balanced with the sensor response time. As the low pass filter passband is reduced to reduce the ripple, the response time of the magnetic field sensor increases, which is undesirable.

Conventional chopper-stabilized amplifiers and magnetic field sensors using the chopper-stabilized amplifiers suffer from certain disadvantages. For example, some conventional chopper-stabilized amplifiers require a relatively low switching frequency, and therefore, as described above, a low pass filter with a relatively narrow passband and a resulting relatively slow response time. For another example, some conventional chopper-stabilized amplifiers suffer from having a relatively low common mode rejection and/or a relatively low rejection of the offset component.

It would be desirable to provide a chopper-stabilized amplifier that can accommodate a relatively high switching frequency, that has a relatively high rejection of a common mode signal, and that has a relatively high rejection of an offset component of an input signal.

SUMMARY OF THE INVENTION

In some embodiments, a magnetic field sensor includes a Hall element, a modulation circuit, a chopper-stabilized amplifier, and a filter, all coupled in series. The output signal from the Hall effect element can include a magnetic field signal component and an offset component. The modulation circuit is responsive to the output signal of the Hall element and operates to modulate only the magnetic field signal component of the output signal from the Hall element. The chopper-stabilized amplifier is responsive to the modulation circuit output signal and provides an amplifier output signal with a reduced offset component. The chopper-stabilized amplifier has particular characteristics such that the chopper-stabilized amplifier can accommodate a relatively high switching frequency, has a relatively high rejection of a common mode signal, and has a relatively high rejection of an offset component of an input signal.

In accordance with one aspect of the present invention, a chopper-stabilized amplifier includes first and second front-end amplifiers, each having a respective input node and a respective feedback node. The first front-end amplifier is configured to generate a first amplified output signal and the second front-end amplifier is configured to generate a second amplified output signal. The chopper-stabilized amplifier also includes a first switching network coupled to receive a binary clock signal having first and second periodic states, coupled to receive the first and second amplified output signals, and configured to generate first and second switched output signals. During the first state of the binary clock signal, the first switched output signal is related to the first amplified output signal and the second switched output signal is related to the second amplified output signal. During the second state of the binary clock signal, the first switched output signal is related to the second amplified output signal and the second switched output signal is related to the first amplified output signal. The chopper-stabilized amplifier also includes first and second back-end amplifiers. The first back-end amplifier is coupled to receive the first switched output signal and the second back-end amplifier is coupled to receive the second switched output signal. The first back-end amplifier is configured to generate a first back-end output signal and the second back-end amplifier is configured to generate a second back-end output signal. An output signal of the chopper-stabilized amplifier is a differential signal comprised of the first and second back-end output signals. The chopper-stabilized amplifier also includes at least one of a feedback circuit or a second switching network coupled to receive the first and second back-end output signals. The other one of the feedback circuit or the second switching network is configured to generate first and second switched feedback signals. The second switching network is coupled to receive the binary clock signal. During the first state of the binary clock signal, the first switched feedback signal is related to the first back-end output signal and the second switched feedback signal is related to the second back-end output signal. During the second state of the binary clock signal, the first switched feedback signal is related to the second back-end output signal and the second switched feedback signal is related to the first back-end output signal. The feedback node of the first front-end amplifier is coupled to receive the first switched feedback signal, and the feedback node of the second front-end amplifier is coupled to receive the second switched feedback signal.

In accordance with another aspect of the present invention, a magnetic field sensor includes a Hall effect element having two output nodes at which is provided a differential output signal that varies in response to a magnetic field. The Hall effect element differential output signal includes a magnetic field signal component and an offset component. The magnetic field sensor also includes a chopper-stabilized amplifier as described above. The input nodes of the first and second front-end amplifiers are coupled to the Hall effect element.

In some embodiments, the magnetic field sensor also includes a modulation circuit coupled between the Hall effect element and the chopper-stabilized amplifier and coupled to receive the binary clock signal. The modulation circuit is operable to modulate the magnetic field signal component to provide to the first and second front-end amplifiers a modulated signal having the modulated magnetic field signal component and having an un-modulated offset component.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
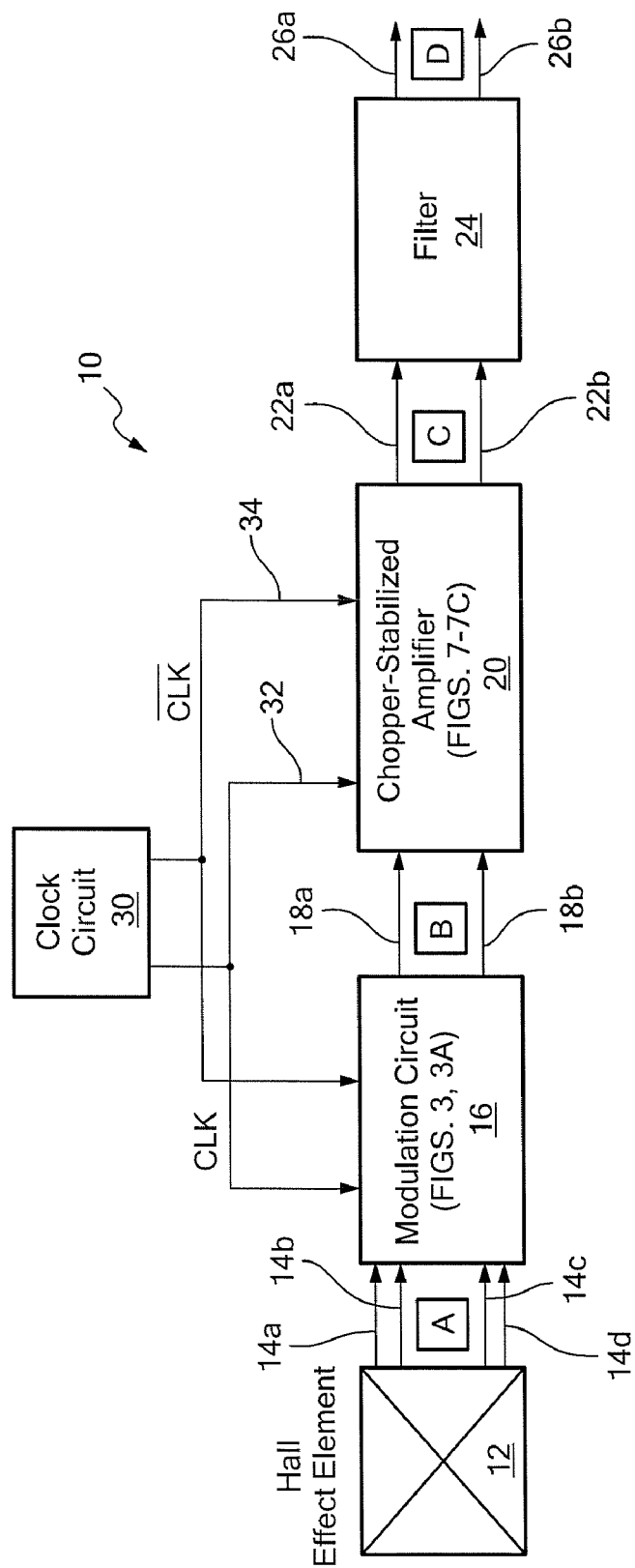
FIG. 1 is a block diagram showing a magnetic field sensor, which includes a Hall effect element, a modulation circuit, a chopper-stabilized amplifier, and a filter.

Referring to FIG. 1, a magnetic field sensor 10 includes a Hall effect element 12 providing four couplings with associated signals 14a-14d to a modulation circuit 16. The modulation circuit 16 can be of a type described below in conjunction with FIGS. 3 and 3A. The modulation circuit provides a differential output signal 18a, 18b to a chopper-stabilized amplifier 20. The chopper-stabilized amplifier 20 provides a differential amplified signal 22a, 22b to a filter module 24. The filter module 24 provides a differential output signal 26a, 26b. In some alternate arrangements, the differential signals 22a, 22b and 26a, 26b can be single ended signals.

The magnetic field sensor 10 also includes a clock circuit 30 configured to provide a clock signal 32 and a complementary (i.e., inverted) clock signal 34 to both the modulation circuit 16 and to the chopper-stabilized amplifier 20. Therefore, switching function of the modulation circuit 16 is synchronous with function of the chopper-stabilized amplifier 20.

It will become apparent from discussion below that, even if the Hall effect element 12 generates a source signal having both a signal component and an offset component, the output signal 26a, 26b from the magnetic field sensor 10 has a predominant magnetic field signal component and a comparatively reduced offset component.

Figure 2:
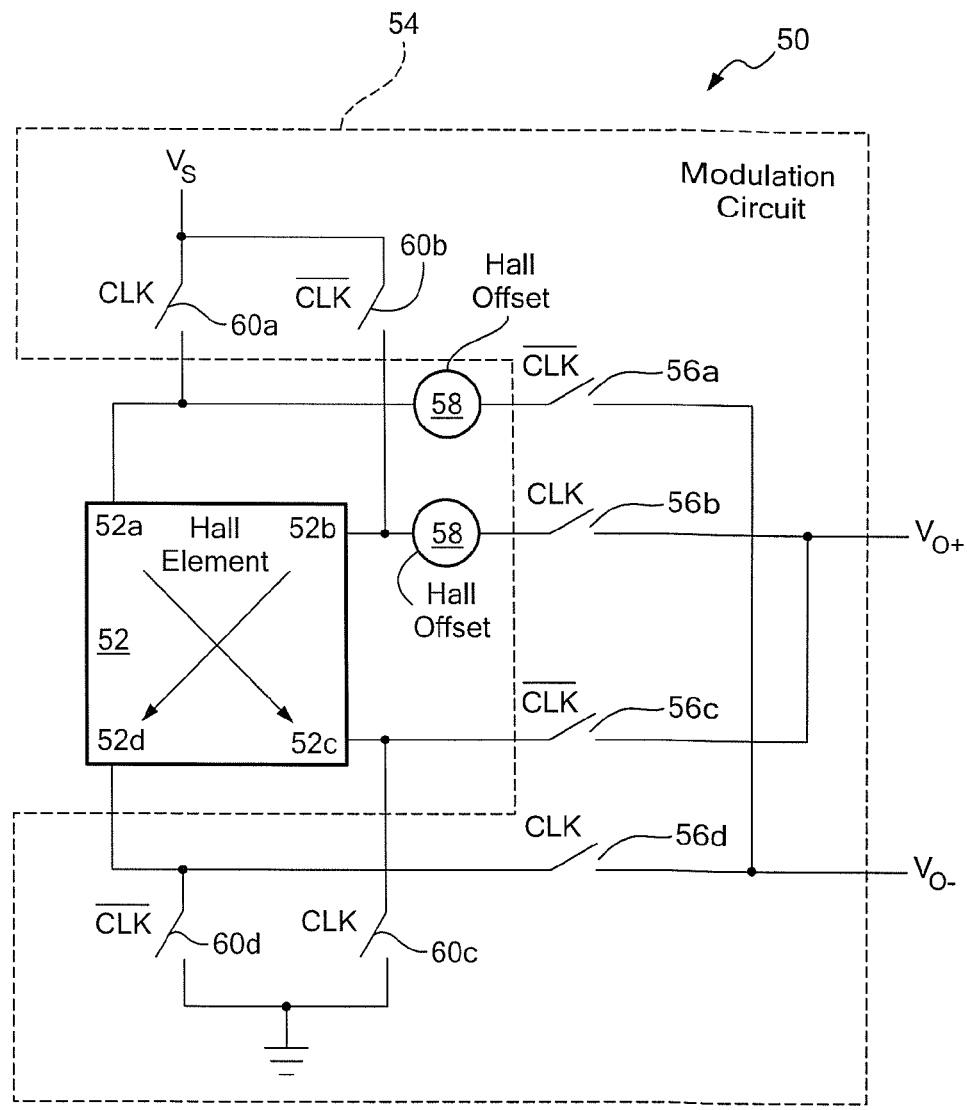
FIG. 2 is a block diagram showing a switched Hall element having a Hall effect element and having a modulation circuit that can be used as the Hall effect element and the modulation circuit in the sensor of FIG. 1 to modulate an offset component.

Referring now to FIG. 2, a switched Hall element 50 of the type that modulates the Hall offset component includes a Hall element (or Hall plate) 52 and a modulation circuit 54. The Hall element 52 includes four contacts 52a, 52b, 52c, and 52d, each coupled to a first terminal of a respective switch 56a, 56b, 56c, and 56d, as shown. Second terminals of switches 56b and 56c are coupled to provide a positive node of a switched Hall output signal, here labeled Vo+, and second terminals of switches 56a and 56d are coupled to provide a negative node of the switched Hall output signal, here labeled Vo−.

Figure 2A:
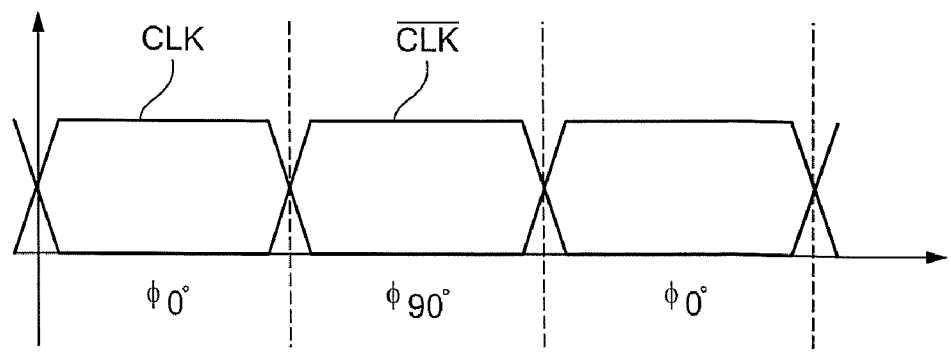
FIG. 2A is a graph showing clock signals for the switched Hall element of FIG. 2.

Additional switches 60a, 60b, 60c, and 60d are arranged to selectively couple the Hall contacts 52a, 52b, 52c, 52d to the supply voltage, Vs, and ground. More particularly, switches 56b, 56d, 60a, and 60c are controlled by a clock signal, CLK, and switches 56a, 56c, 60b, and 60d are controlled by a complementary clock signal, CLK/, as shown. The clock signals CLK and CLK/ have two states or phases, a $\Phi_{0°}$ state and a $\Phi_{90°}$ state, as shown in FIG. 2A.

Figure 2B:
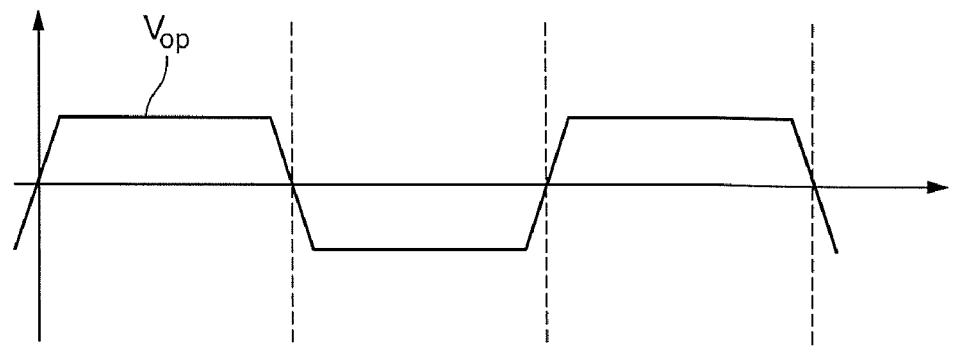
FIG. 2B is a graph showing a modulated offset component provided by the switched Hall element of FIG. 2.
Figure 2C:
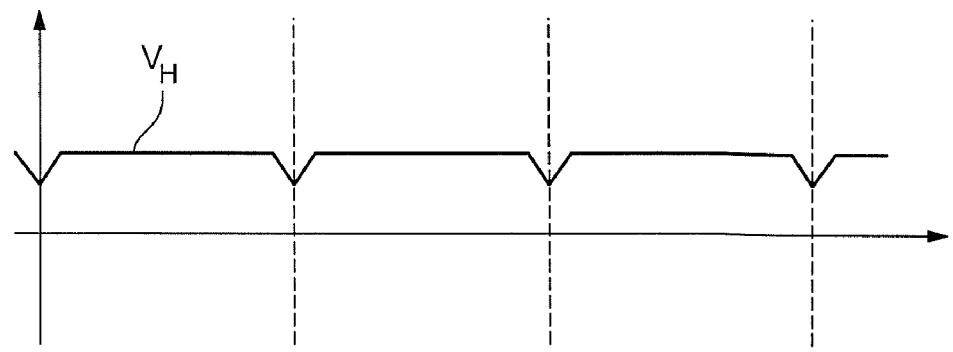
FIG. 2C is a graph showing an un-modulated magnetic field signal component provided by the switched Hall element of FIG. 2.

In operation, during phase $\Phi_{0°}$, current flows from the terminal 52a to the terminal 52c and the switched Hall output signal, Vo, is equal to $V_H+V_{op}$, where $V_{op}$ is the Hall element offset voltage or Hall offset component and $V_H$ is the magnetic filed signal component. During the phase $\Phi_{90°}$, current flows from the terminal 52b to the terminal 52d and the switched Hall output signal, Vo, is equal to $V_H-V_{op}$. Thus, the modulation circuit 54 modulates the Hall offset component, $V_{op}$, which is shown in FIG. 2B for a zero Gauss magnetic field. The magnetic field signal component, $V_H$, remains substantially invariant, as shown in FIG. 2C.

Figure 3:
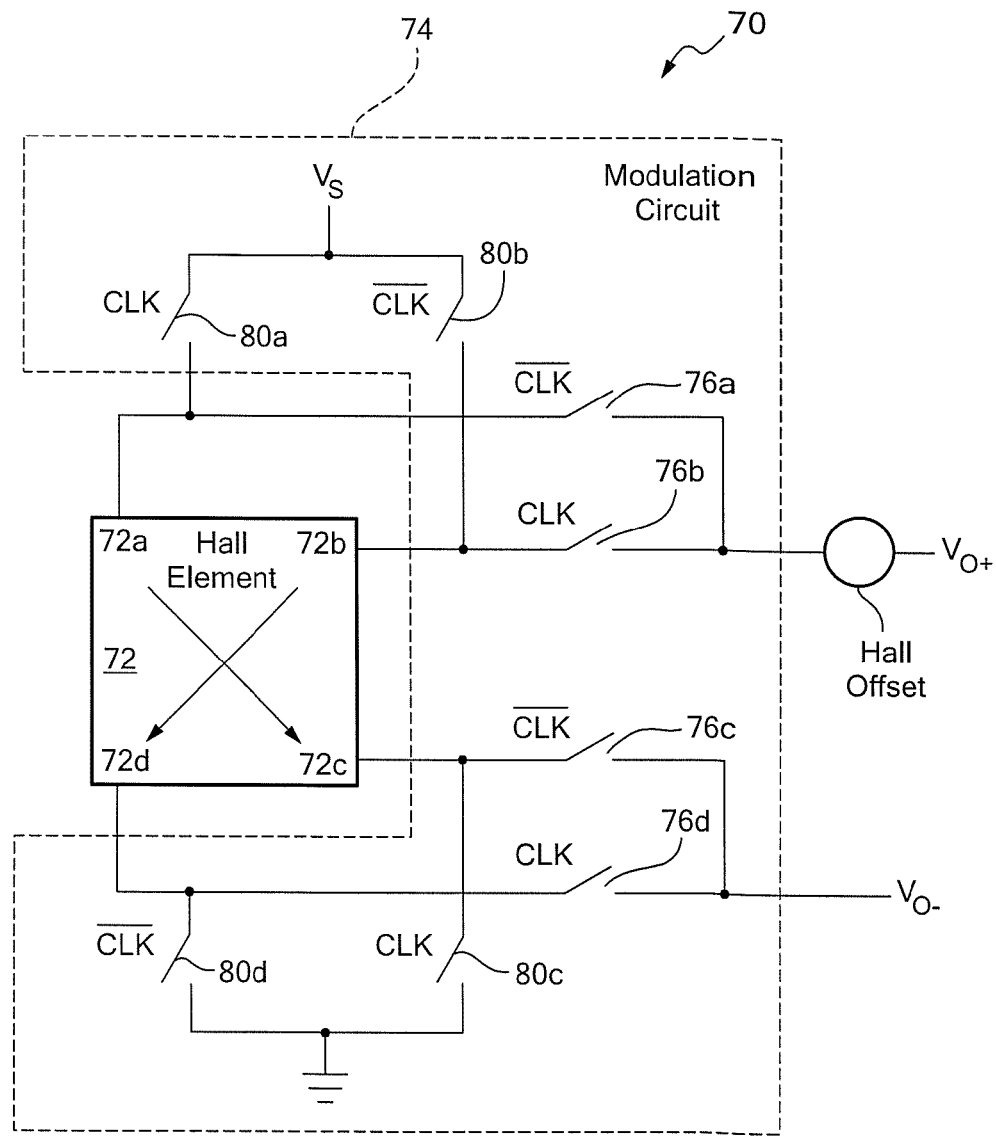
FIG. 3 is a block diagram showing a switched Hall element having a Hall effect element and having a modulation circuit that can be used as the Hall effect element and the modulation circuit in the sensor of FIG. 1 to modulate a magnetic field signal component.
Figure 3A:
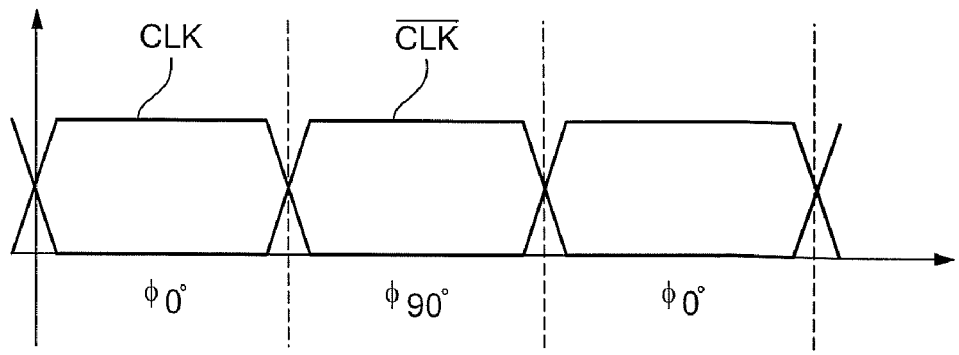
FIG. 3A is a graph showing clock signals for the switched Hall element of FIG. 3.

Referring now to FIG. 3, an alternative switched Hall element 70 of the type that modulates the magnetic signal component includes a Hall element 72 and a modulation circuit 74. The Hall effect element 72 is the same as the Hall effect element 52 of FIG. 2 and includes four contacts 72a, 72b, 72c, and 72d, each coupled to a first terminal of a respective switch 76a, 76b, 76c, and 76d. Second terminals of switches 76a and 76b are coupled to provide a positive node of a switched Hall output signal, here labeled Vo+, and second terminals of switches 56c and 56d are coupled to provide a negative node of the switched Hall output signal, here labeled Vo−. Thus, a comparison of FIGS. 2 and 3 reveals that the output contacts of the Hall element are interchanged during the $\Phi_{90°}$ phase.

Additional switches 80a, 80b, 80c, and 80d are arranged to selectively couple the Hall contacts 72a, 72b, 72c, and 72d to the supply voltage Vs and ground. Switches 76b, 76d, 80a, and 80c are controlled by clock signal, CLK, and switches 76a, 76c, 80b, and 80d are controlled by a complementary clock signal, CLK/, as shown. Clock signals, CLK and CLK/, are identical to like signals in FIG. 2 and thus have two states or phases, $\Phi_{0°}$ and $\Phi_{90°}$, as shown.

Figure 3B:
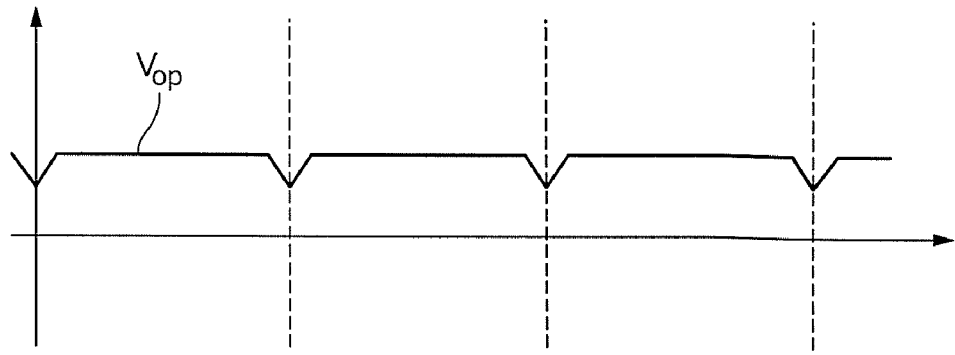
FIG. 3B is a graph showing an un-modulated offset component provided by the switched Hall element of FIG. 3.
Figure 3C:
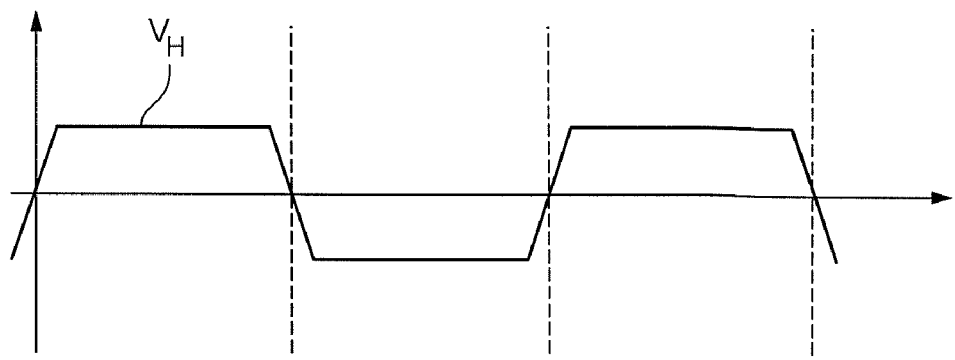
FIG. 3C is a graph showing a modulated magnetic field signal component provided by the switched Hall element of FIG. 3.

In operation, during phase $\Phi_{0°}$, current flows from the terminal 72a to the terminal 72c, and the switched Hall output signal, Vo, is equal to $V_H+V_{op}$. During phase $\Phi_{90°}$, current flows from the terminal 72b to the terminal 72d, and the switched Hall output signal, Vo, is equal to $-V_H+V_{op}$. Thus, the modulation circuit 74 modulates the magnetic signal component to provide a modulated magnetic signal component, $V_H$, which is shown in FIG. 3C for a zero Gauss magnetic field. The offset component, $V_{op}$, remains substantially invariant as is shown in FIG. 3B.

It will be understood from discussion below in conjunction with FIGS. 7-7C that in a preferred embodiment, the modulation circuit 16 of FIG. 1 is of a type described above in conjunction with FIGS. 3-3C, rather than of a type described above in conjunction with FIGS. 2-2C. In other words, in a preferred embodiment, the chopper-stabilized amplifier 20 of FIG. 1 receives the differential signal 18a, 18b having a modulated signal component and an un-modulated offset component.

Figure 4:
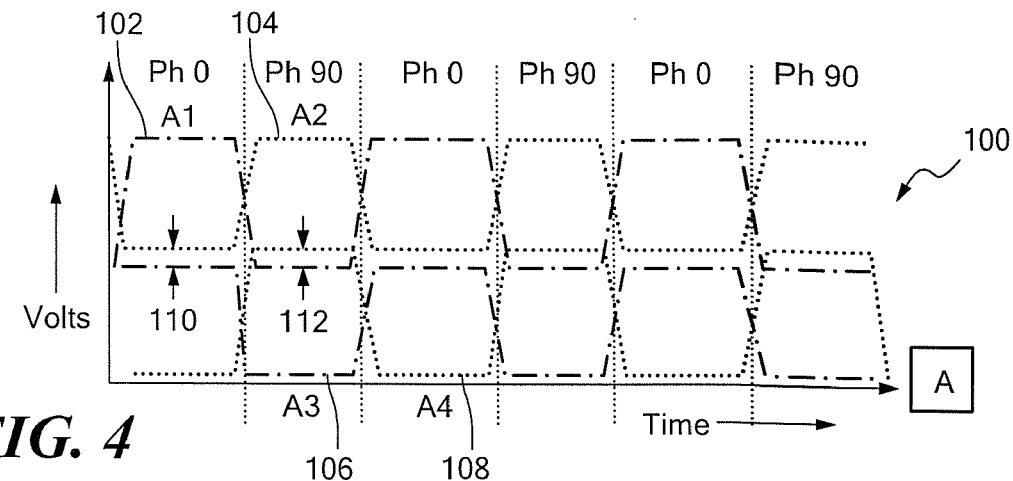
FIG. 4 is a graph showing four single-ended signals appearing at a point A of FIG. 1.
Figure 4A:
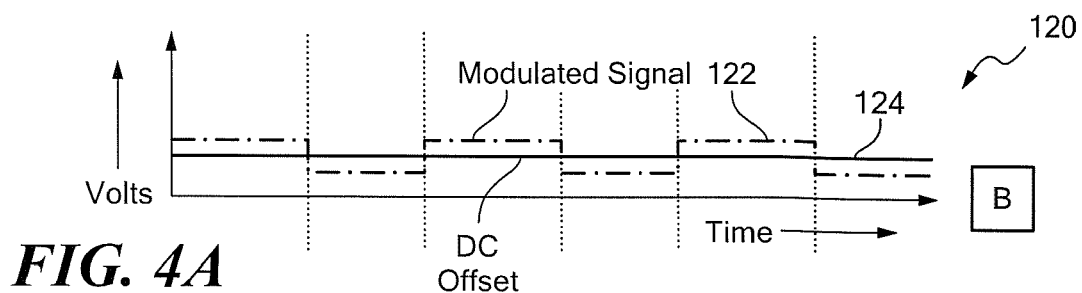
FIG. 4A is a graph showing a differential signal having a modulated magnetic field signal component and an un-modulated offset component appearing at a point B of FIG. 1.
Figure 4B:
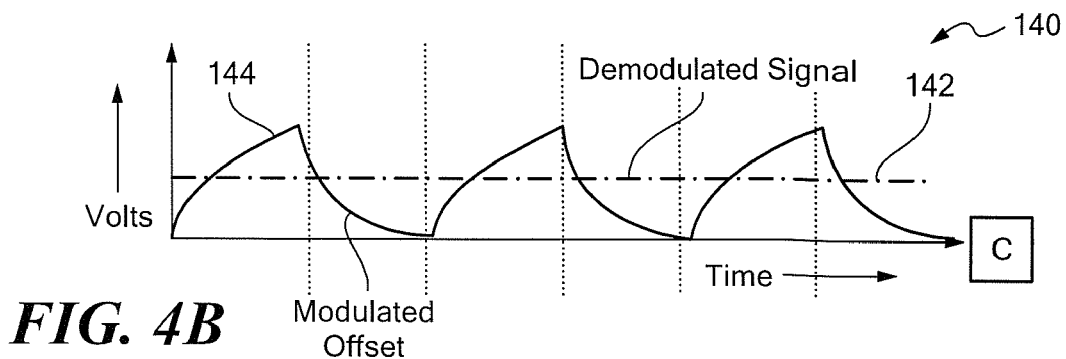
FIG. 4B is a graph showing a differential signal having a demodulated magnetic field signal component and a modulated offset component appearing at a point C of FIG. 1.
Figure 4C:
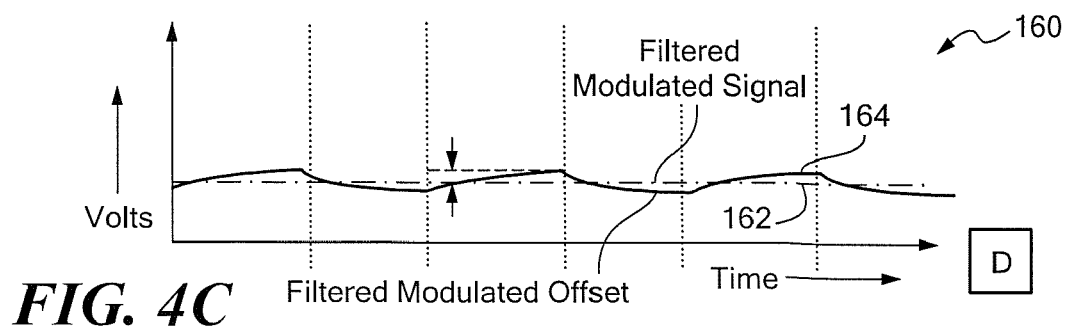
FIG. 4C is a graph showing a filtered differential signal having a demodulated signal component and a filtered modulated offset component appearing at a point D of FIG. 1.

Referring now to FIGS. 4-4C, graphs 100, 120, 140, 160 are indicative of signals appearing at points A, B, C, and D, respectively, of FIG. 1. The graphs 100, 120, 140, 160 each have a horizontal axis with a scale in arbitrary units of time and a vertical axis with a scale in arbitrary units of volts.

The graph 100 includes four signals 102, 104, 106, 108, which are indicative of signals 14a, 14b, 14c, 14d, respectively, i.e., the signal A, shown in FIG. 1, and which are also indicative of the four signals received by the switches 76a, 76b, 76c, 76d of FIG. 3. In any half cycle of the clock signal, CLK, of FIGS. 1 and 3, two of the signals (102 and 108 or 104 and 106) are present at the output of the modulation circuit as the signals $V_o+$ and $V_o-$ of FIG. 3, which are the signals 18a, 18b of FIG. 1, i.e., the signal B of FIG. 1. Differences between the signals $V_o+$ and $V_o-$ of FIG. 3 and between the signals 18a, 18b of FIG. 1 are differential signals.

During a phase, Ph 0, signals 104 and 106 differ by an amount 110. During a phase Ph 90, signals 108 and 102 differ by an amount 112, which is opposite in polarity from the difference of the signals 104 and 106. A signal 122 of FIG. 4A is representative of the above-described difference of signals, is also representative of a sum of the signals $V_{op}$ and $V_H$ of FIGS. 3B and 3C, and is also representative of a differential signal B of FIG. 1. The AC part of the signal 122 is representative of a modulated magnetic field signal component of the signal 122. A line 124 is representative of a DC part of the signal 122, i.e., an offset component of the signal 122, which is an un-modulated offset component.

A signal 144 is representative of the differential signal 22a, 22b of FIG. 1, i.e., the signal C of FIG. 1. The signal 144 can have rounded edges due to band limiting effects of the chopper-stabilized amplifier 20 of FIG. 1, depending upon a frequency of the clock signal 32, 34 of FIG. 1. The signal 144 is larger than the signal 122 due to amplification provided by the chopper-stabilized amplifier 20 of FIG. 1. The signal 144 has an AC part representative the offset component 124 of FIG. 4A, and is a modulated offset component generated by way of the chopper-stabilized amplifier 20 of FIG. 1. A line 142 is representative of a DC part of the signal 144, and is a demodulated version of the AC part of the modulated magnetic field signal 122.

It should be recognized that the desired signal is the DC part of the signal 144 represented by the line 142 and the undesired signal is the AC part of the signal 144. It should also be understood that the DC part of the signal 144 represented by the line 142 is only a DC signal when the magnetic field sensor 10 of FIG. 1 experiences a static magnetic field. In other words, if the magnetic field sensor 10 of FIG. 1 experiences a varying magnetic field, then the part of the signal 144 represented by the line 142 will have a varying (AC) part.

A curve 164 is representative of the differential signal 26a, 26b of FIG. 1, i.e., the signal D of FIG. 1. The curve 164 is a filtered version of the curve 144. It should be recognized that filtering the signal 144 to achieve the signal 164 removes much of the AC part of the signal 144, leaving a signal more closely representative of the desired DC part of the signal 144, of which lines 142 and 162 are representative. However, as described above, it should also be understood that the DC part of the signal 164 represented by the line 162 is only a DC signal when the magnetic field sensor 10 of FIG. 1 experiences a static magnetic field.

Figure 5:
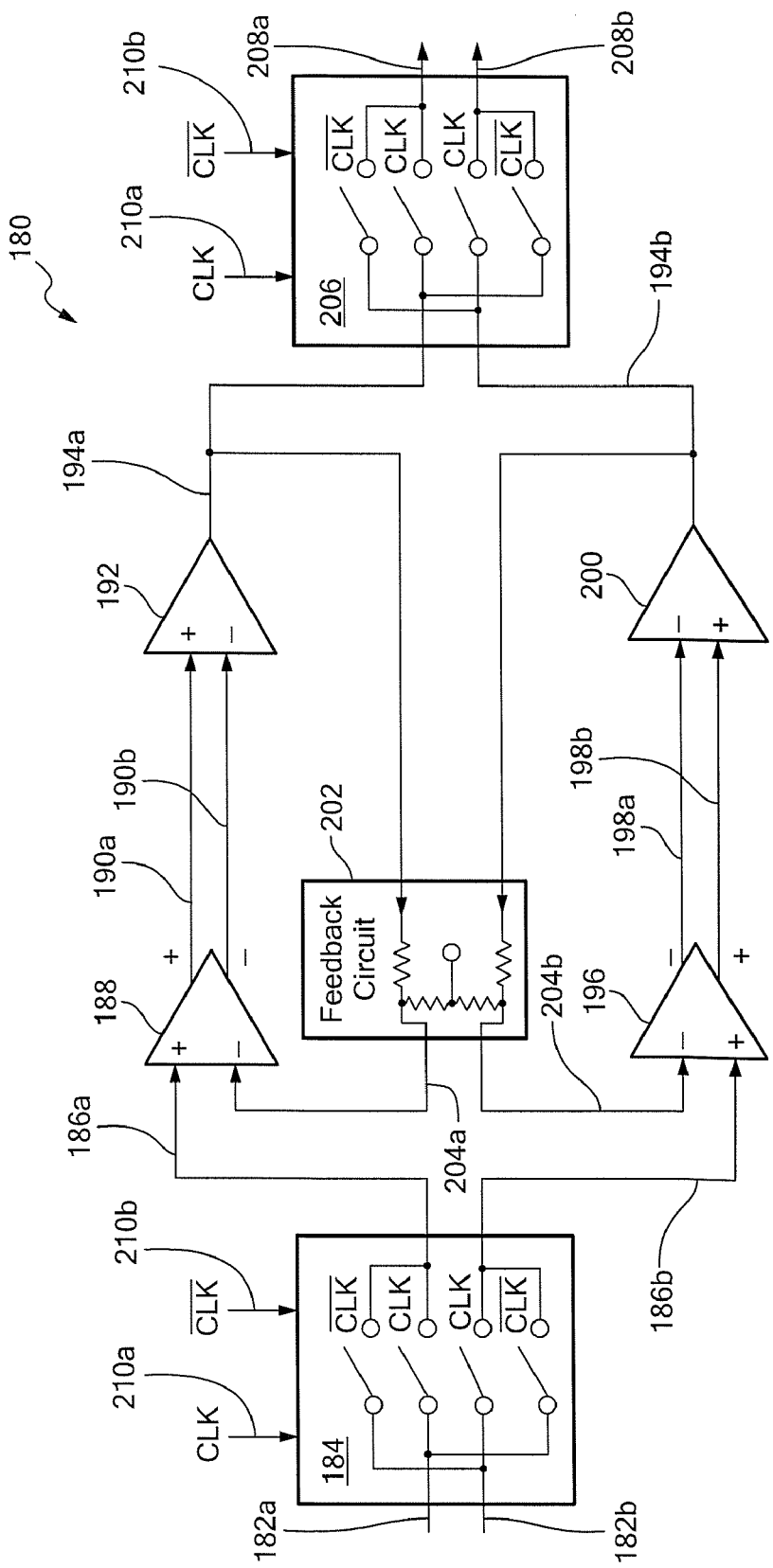
FIG. 5 is a block diagram showing a type of prior art chopper-stabilized amplifier.

Referring now to FIG. 5, a prior art chopper-stabilized amplifier 180 includes a first switching network 184 for receiving a differential signal 182a, 182b. The first switching network 184 provides a first switched signal 186a to a first front-end amplifier 188 and a second switched signal 186b to a second front-end amplifier 196. Taken together, the signals 186a, 186b are a switched differential signal. The first front-end amplifier 188 provides a differential signal 190a, 190b to a first back-end amplifier 192 and the second front-end amplifier 196 provides a differential signal 198a, 198b to a second back-end amplifier 200. The first back-end amplifier 192 provides a first back-end output signal 194a to a second switching network 206 and the second back-end amplifier 200 provides a second back-end output signal 194b to the second switching network 206. The second switching network provides a differential output signal 208a, 208b from the chopper-stabilized amplifier 180.

The first back-end amplifier 192 also provides the first back-end output signal 194a to a feedback network 202 and the second back-end amplifier 200 also provides the second back-end output signal 194b to the feedback network 202. The feedback network 202 provides a first feedback signal 204a to a feedback node of the first front-end amplifier 188 and the feedback network also provides a second feedback signal 204b to a feedback node of the second front-end amplifier 196. The first and second switching networks 184, 206, respectively are coupled to receive a clock signal 210a and an inverted clock signal 210b.

One of ordinary skill in the art will be familiar with operation of the chopper-stabilized amplifier 180, thus, the operation will not be discussed herein in detail. However, it should be recognized that the chopper-stabilized amplifier 180 suffers from certain disadvantages.

The chopper-stabilized amplifier 180 is unable to support very high frequency of the clock signals 210a, 210b. This is partially because the second switching network 206 is after the back-end amplifiers 192, 200, which are generally band-limited when compared to the front-end amplifiers 188, 196. For example, in some arrangements, the first and second back-end amplifiers 192, 200 are Miller amplifiers, each having at least one respective pole in the frequency domain. As a result, the frequency of the clock signals 210a, 210b is generally limited to about twenty kilohertz.

Figure 6:
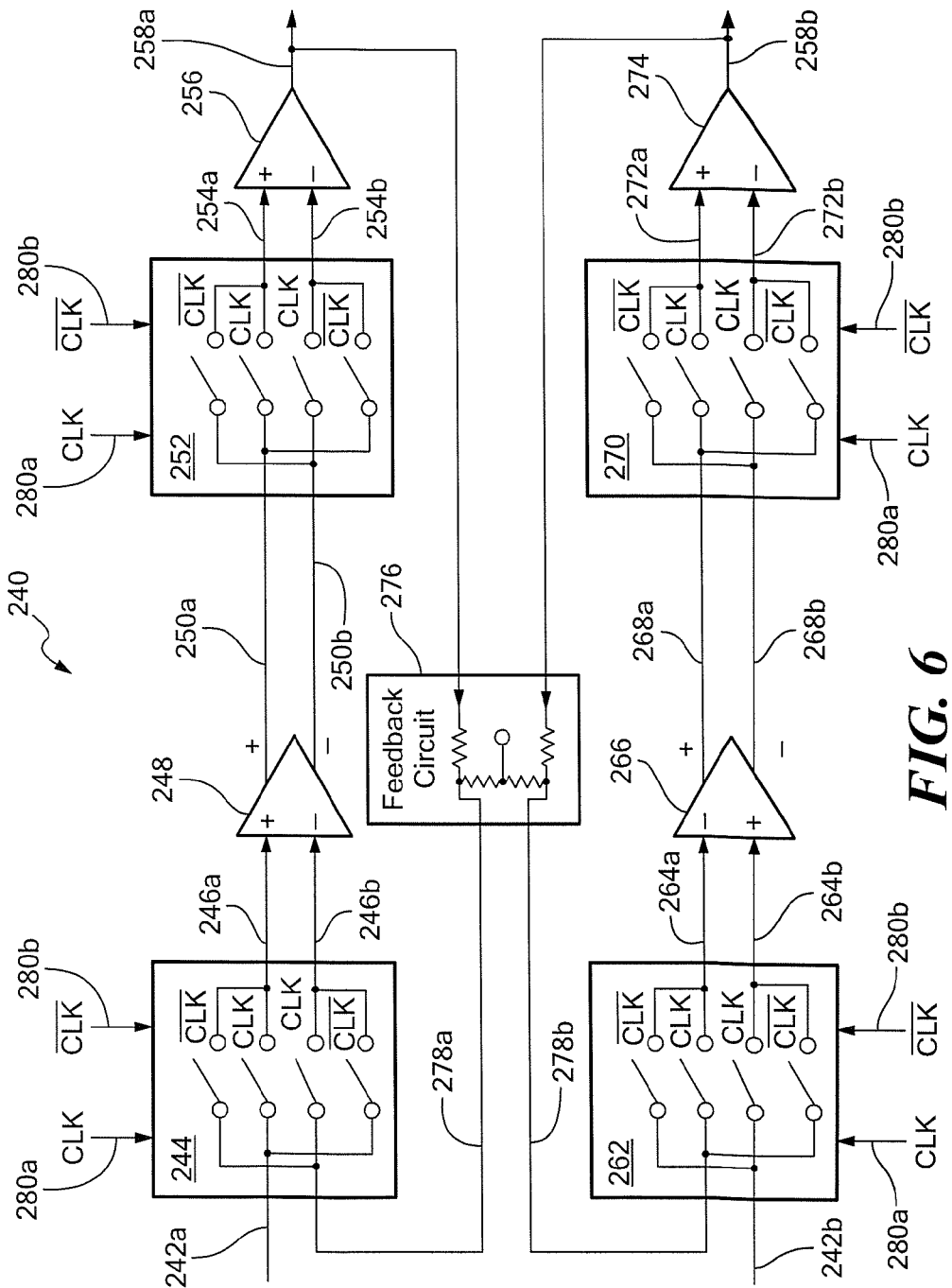
FIG. 6 is a block diagram showing another type of prior art chopper-stabilized amplifier.

Referring now to FIG. 6, another prior art chopper-stabilized amplifier 240 includes first and second switching networks 244, 262, respectively, for receiving a differential signal 242a, 242b. The first switching network 244 provides a switched differential signal 246a, 246b to a first front-end amplifier 248 and the second switching network 262 provides a switched differential signal 264a, 264b to a second front-end amplifier 266. The first front-end amplifier 248 provides a first differential amplified output signal 250a, 250b and the second front-end amplifier 266 provides a second differential amplified output signal 268a, 268b. The first differential amplified output signal 250a, 250b is received by a third switching network 252 and the second differential amplified output signal 268a, 268b is received by a fourth switching network 270. The third switching network 252 provides a differential signal 254a, 254b to a first back-end amplifier 256 and the fourth switching network 270 provides a differential signal 272a, 272b to a fourth back-end amplifier 274. The first back-end amplifier 256 provides a first back-end output signal 258a and the second back-end amplifier 274 provides a second back-end output signal 258b. The first and second back-end output signals 258a, 258b, respectively, together constitute a differential output signal from the chopper-stabilized amplifier 240.

A feedback circuit 276 receives the first and second back-end output signals 258a, 258b and provides a first feedback signal 278a to the first switching network 244. The feedback circuit 276 also provides a second feedback signal 278b to the second switching network 262. The first, second, third, and fourth switching networks 244, 262, 252, 270, respectively, are coupled to receive a clock signal 280a and an inverted clock signal 280b.

One of ordinary skill in the art will be familiar with operation of the chopper-stabilized amplifier 240, so the operation will not be discussed herein in detail. However, it should be recognized that the chopper-stabilized amplifier 240 suffers from certain disadvantages.

It will be recognized that the chopper-stabilized amplifier 240 can support higher clock frequencies than the chopper-stabilized amplifier 180 of FIG. 5. This is due in-part to the placement of the switching networks 244, 266, 252, 270, which are before the band-limited back end amplifiers 256, 270.

However, the chopper-stabilized amplifier 240 is unable to provide as high a common mode rejection or as high a rejection of the above-described offset component as the chopper-stabilized amplifier 180 of FIG. 5. This is partially because the separate switching networks 244, 262 provide separate inputs to the first and second front-end amplifiers 248, 260, respectively: Unbalances within each front end amplifier will translate common mode signals into differential mode signals. Of particular concern, common mode interference having a frequency the same as the frequency of the clock signal 280a, 280b is translated into differential mode due to a finite common mode rejection between the first and second front end amplifiers 248, 266, which at the same time is down converted (to DC) by means of the third and fourth switching circuits 252, 270, respectively. Moreover, different common mode rejection provided by each individual front end amplifier 244, 266 can generate a difference on the generated differential signals 250a, 250b and 268a, 268b at the output of each front end amplifier 248, 262, yielding a differential signal at the very output 258a, 258b of the chopper-stabilized amplifier 240.

Figure 7:
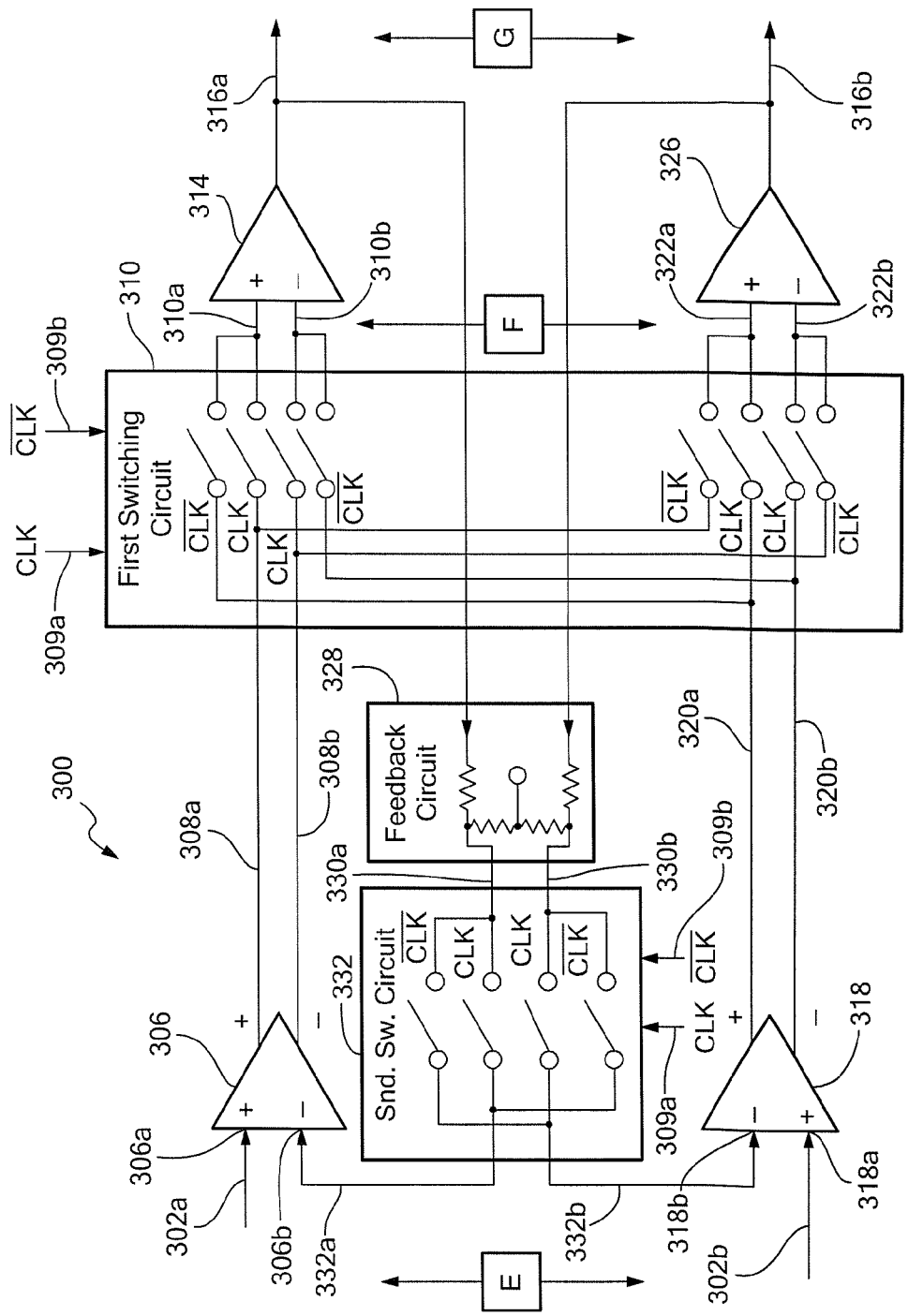
FIG. 7 is a block diagram showing a chopper-stabilized amplifier in accordance with the present invention, which can be used as the chopper-stabilized amplifier of FIG. 1.

Referring now to FIG. 7, a chopper-stabilized amplifier 300 includes first and second front-end amplifiers, 306, 318, respectively, each having a respective input node 306a, 318a, and a respective feedback node 306b, 318b. The first front-end amplifier 306 is configured to generate a first amplified output signal 308a, 308b (which can be a differential signal)

and the second front-end amplifier 318 is configured to generate a second amplified output signal 320a, 320b (which can be a differential signal).

The chopper-stabilized amplifier 300 also includes a first switching network 310 coupled to receive a binary clock signal 309a, 309b having first and second periodic states. The first switching network 310 is also coupled to receive the first and second amplified output signals 308a, 308b and 320a, 320b respectively. The first switching network 310 is configured to generate first and second switched output signals 310a, 310b and 322a, 322b, respectively, each of which can be differential signals.

During the first state of the binary clock signal 309a, 309b, the first switched output signal 310a, 310b is related to the first amplified output signal 308a, 308b and the second switched output signal 322a, 322b is related to the second amplified output signal 320a, 320b. In some embodiments, during the first state of the binary clock signal 309a, 309b, the first switched output signal 310a, 310b is equal to the first amplified output signal 308a, 308b and the second switched output signal 322a, 322b is equal to the second amplified output signal 320a, 320b. In some embodiments, during the first state of the binary clock signal 309a, 309b, the first switched output signal 310a, 310b is linearly related to the first amplified output signal 308a, 308b and the second switched output signal 322a, 322b is linearly related to the second amplified output signal 320a, 320b.

During the second state of the binary clock signal 309a, 309b, the first switched output signal 310a, 310b is related to the second amplified output signal 320a, 320b and the second switched output signal 322a, 322b is related to the first amplified output signal 308a, 308b. In some embodiments, during the second state of the binary clock signal 309a, 309b, the first switched output signal 310a, 310b is equal to the second amplified output signal 320a, 320b and the second switched output signal 322a, 322b is equal to the first amplified output signal 308a, 308b. In some embodiments, during the second state of the binary clock signal 309a, 309b, the first switched output signal 310a, 310b is linearly related to the second amplified output signal 320a, 320b and the second switched output signal 322a, 322b is linearly related to the first amplified output signal 308a, 308b.

The chopper-stabilized amplifier 300 also includes first and second back-end amplifiers 314, 326, respectively. The first back-end amplifier 314 is coupled to receive the first switched output signal 310a, 310b and the second back-end amplifier 326 is coupled to receive the second switched output signal 322a, 322b. The first back-end amplifier 314 is configured to generate a first back-end output signal 316a and the second back-end amplifier 326 is configured to generate a second back-end output signal 316b. An output signal of the chopper-stabilized amplifier is a differential signal 316a, 316b comprised of the first and second back-end output signals 316a, 316b, respectively.

The chopper-stabilized amplifier 300 also includes a feedback circuit 328 coupled to receive the first and second back-end output signals 316a, 316b, respectively, and configured to generate first and second feedback signals 330a, 330b, respectively. The chopper-stabilized amplifier 300 also includes a second switching network 332 coupled to receive the binary clock signal 309a, 309b, coupled to receive the first and second feedback signals 330a, 330b, respectively, and configured to generate first and second switched feedback signals 332a, 332b, respectively.

During the first state of the binary clock signals 309a, 309b, the first switched feedback signal 332a is related to the first feedback signal 330a, which is related to the first back-end output signal 316a, and the second switched feedback 332b signal is related to the second feedback signal 330b, which is related to the second back-end output signal 316b. In some embodiments, during the first state of the binary clock signals 309a, 309b, the first switched feedback signal 332a is equal to the first feedback signal 330a and the second switched feedback 332b signal is equal to the second feedback signal 330b. In some embodiments, during the first state of the binary clock signals 309a, 309b, the first switched feedback signal 332a is linearly related to the first feedback signal 330a and the second switched feedback 332b signal is linearly related to the second feedback signal 330b.

During the second state of the binary clock signals 309a, 309b, the first switched feedback signal 332a is related to the second feedback signal 330b, which is related to the second back-end output signal 316b, and the second switched feedback signal 332b is related to the first feedback signal 330a, which is related to the first back-end output signal 316a. In some embodiments, during the second state of the binary clock signals 309a, 309b, the first switched feedback signal 332a is equal to the second feedback signal 330b and the second switched feedback signal 332b is equal to the first feedback signal 330a. In some embodiments, during the second state of the binary clock signals 309a, 309b, the first switched feedback signal 332a is linearly related to the second feedback signal 330b and the second switched feedback signal 332b is linearly related to the first feedback signal 330a.

It will be apparent that, in some embodiments, the feedback circuit 328 and the second switching network 332 can be swapped in position.

The feedback node 306b of the first front-end amplifier 306 is coupled to receive the first switched feedback signal 332a and the feedback node 318b of the second front-end amplifier 318 is coupled to receive the second switched feedback signal 332b.

In some embodiments, the feedback circuit 328 includes first, second, and third resistors, each having first and second respective nodes. The first node of the first resistor is coupled to receive the first back-end output signal 316a. The first node of the second resistor is coupled to receive the second back-end output signal 316b. The third resistor is coupled between the second nodes of the first and second resistors. The first feedback signal 330a is generated at the second node of the first resistor and the second feedback signal 330b is generated at the second node of the second resistor. In some embodiments, the third resistor comprises two series coupled resistors.

In some embodiments, the input nodes 308a, 318a of the first and second front-end amplifiers 308, 318, respectively, are coupled to receive a modulated differential input signal 302a, 302b. In some embodiments, the modulated differential input signal 302a, 302b includes a modulated signal component and an un-modulated offset component. In other arrangements, the modulated differential input signal 302a, 302b includes an un-modulated signal component and a modulated offset component. In some embodiments, the differential input signal 302a, 302b is unmodulated.

In some embodiments, the first and second amplified output signals 308a, 308b and 320a, 320b are differential signals and the first and second switched output signals 310a, 310b and 322a, 322b are differential signals. However, in other embodiments, the first and second amplified output signals 308a, 308b and 320a, 320b are single ended signals. Also, in other embodiments, the first and second switched output signals 310a, 310b and 322a, 322b are single ended signals.

Switches shown within the first switching network 310 and within the second switching network 332 can be a variety of types of switches, including, but not limited to, transistor switches, CMOS switches, and FET switches.

In operation, for embodiments in which the modulated differential input signal 302a, 302b includes a modulated signal component and an un-modulated offset component (see, e.g., FIG. 4A), it will be understood that the first and second back-end output signals 316a, 316b include a modulated offset component and an un-modulated signal component (see, e.g., FIG. 4B.) The unmodulated signal component is essentially a demodulated version of the modulated signal component received at the input to the chopper-stabilized amplifier 300.

In some embodiments, the first and second front-end amplifiers 306, 318 have a relatively larger gain-bandwidth product and the first and second back-end amplifiers 314, 318 have a relatively lower gain-bandwidth product. For example, in some embodiments, the first and second front-end amplifiers 306, 318 have a gain-bandwidth product in the range of about 100 kHz to 5 MHz and the first and second back-end amplifiers 314, 326 have a gain bandwidth product less than the gain bandwidth product of the front-end amplifiers 306, 318. In some embodiments, the first and second back-end amplifiers 314, 326 have a gain-bandwidth product in the range of about 10 kHz to 500 kHz.

In some embodiments, the first and second back-end amplifiers 314, 226 are Miller amplifiers, each having at least one respective pole in the frequency domain.

In some embodiments, the binary clock signal 309a, 309b has a frequency in a range of about 100 kHz to 1 MHz.

The chopper-stabilized amplifier 300 offers advantages over the chopper-stabilized amplifier 180 of FIG. 5 and the chopper-stabilized amplifier 240 of FIG. 6. Namely, the chopper-stabilized amplifier 300 can support higher frequencies of the clock signals 210a, 210b than the chopper-stabilized amplifier 180, and a higher rejection of common mode and of offset components than the chopper-stabilized amplifier 240 of FIG. 6.

In some alternate arrangements, a third switching network (not shown) is coupled to receive the output signals 316a, 316b, coupled to receive the clock signals 309a, 309b, and configured to provide a further differential output signal (not shown). These embodiments are particularly useful for arrangements in which the input signal 302a, 302b is un-modulated. However, these embodiments would suffer the same disadvantages described above in conjunction with the chopper-stabilized amplifier 180 of FIG. 5

Figure 7A:
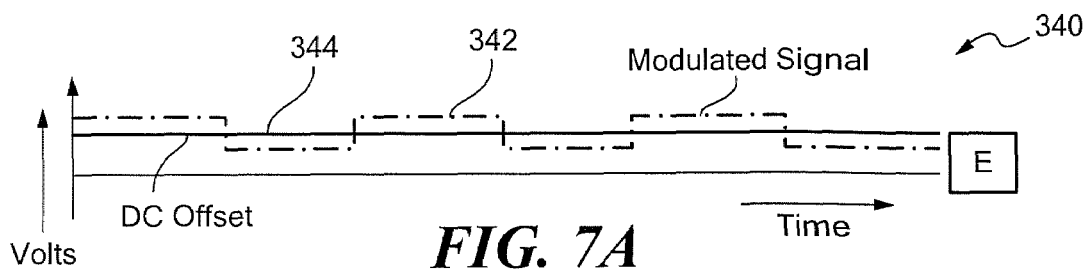
FIG. 7A is a graph showing a differential signal having a modulated signal component and an un-modulated offset component appearing at a point E of FIG. 7.
Figure 7B:
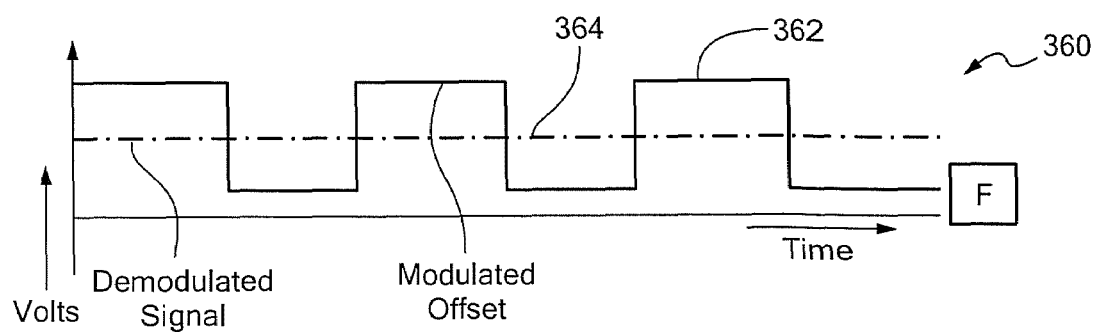
FIG. 7B is a graph showing a differential signal having a modulated offset component and a demodulated signal component appearing at a point F of FIG. 7.
Figure 7C:
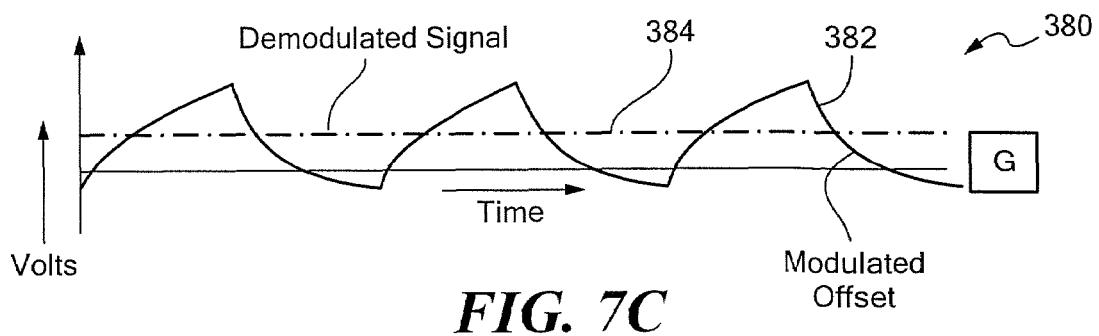
FIG. 7C is a graph showing a differential signal having a band-limited modulated offset component and a demodulated signal component appearing at a point G of FIG. 7.

Referring now to FIGS. 7A-7C, graphs 340, 360, 380 are indicative of signals appearing at points E, F, and G, respectively, of FIG. 7. It will be recognized that point E can be the same as point B of FIG. 1. It will also be recognized that point G can be the same as point C of FIG. 1. Point F, however, is internal to the chopper-stabilized amplifier 20 of FIG. 1. The graphs 340, 360, 380 each have a horizontal axis with a scale in arbitrary units of time and a vertical axis with a scale in arbitrary units of volts.

The graph 340, and signals appearing therein, is the same as the graph 120 of FIG. 4A. The graph 380, and signals appearing therein, is the same as the graph 140 of FIG. 4B. The graph 360 includes a signal 362 internal to the chopper-stabilized amplifier 20 of FIG. 1, which is an amplified and modulated offset component having a demodulated signal component 364. The signal 362 is larger than a signal 342 due to amplification provided by the chopper-stabilized amplifier 300 of FIG. 7.

It will be recognized that the AC part of the signal 342 comprises a modulated signal component, while the AC part of signal 362 and of signal 382 comprises a modulated offset component, which can be substantially removed by way of the low pass filter 24 of FIG. 1.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

The invention claimed is:

1. A chopper-stabilized amplifier, comprising:

first and second front-end amplifiers, each having a respective input node and each having a respective feedback node, wherein the first front-end amplifier is configured to generate a first amplified output signal and the second front-end amplifier is configured to generate a second amplified output signal;

a first switching network coupled to receive a binary clock signal having first and second periodic states, coupled to receive the first and second amplified output signals, and configured to generate first and second switched output signals, wherein, during the first state of the binary clock signal, the first switched output signal is related to the first amplified output signal and the second switched output signal is related to the second amplified output signal, and wherein, during the second state of the binary clock signal, the first switched output signal is related to the second amplified output signal and the second switched output signal is related to the first amplified output signal;

first and second back-end amplifiers, wherein the first back-end amplifier is coupled to receive the first switched output signal and the second back-end amplifier is coupled to receive the second switched output signal, wherein the first back-end amplifier is configured to generate a first back-end output signal and the second back-end amplifier is configured to generate a second back-end output signal, wherein an output signal of the chopper-stabilized amplifier is a differential signal comprised of the first and second back-end output signals; and at least one of a feedback circuit or a second switching network coupled to receive the first and second back-end output signals, wherein the other one of the feedback circuit or the second switching network is configured to generate first and second switched feedback signals, wherein the second switching network is coupled to receive the binary clock signal, wherein, during the first state of the binary clock signal, the first switched feedback signal is related to the first back-end output signal and the second switched feedback signal is related to the second back-end output signal, and wherein, during the second state of the binary clock signal, the first switched feedback signal is related to the second back-end output signal and the second switched feedback signal is related to the first back-end output signal, wherein the feedback node of the first front-end amplifier is coupled to receive the first switched feedback signal, and wherein the feedback node of the second front-end amplifier is coupled to receive the second switched feedback signal.

2. The chopper-stabilized amplifier of claim 1, wherein the feedback circuit comprises first, second, and third series coupled resistors.

3. The chopper-stabilized amplifier of claim 2, wherein the third resistor comprises two series coupled resistors.

4. The chopper-stabilized amplifier of claim 1, wherein the input nodes of the first and second front-end amplifiers are coupled to receive a modulated differential input signal.

5. The chopper-stabilized amplifier of claim 4, wherein the first and second amplified output signals are differential signals and wherein the first and second switched output signals are differential signals.

6. The chopper-stabilized amplifier of claim 4, wherein the modulated differential input signal includes a modulated signal component and an un-modulated offset component.

7. The chopper-stabilized amplifier of claim 1, wherein the first and second back-end output signals include a modulated offset component and an un-modulated signal component.

8. The chopper-stabilized amplifier of claim 1, wherein the first and second front-end amplifiers have a relatively larger gain-bandwidth product, and wherein the first and second back-end amplifiers have a relatively lower gain-bandwidth product.

9. The chopper-stabilized amplifier of claim 8, wherein the first and second front-end amplifiers have a gain-bandwidth product in the range of about 100 kHz to 5 MHz.

10. The chopper-stabilized amplifier of claim 9, wherein the first and second back-end amplifiers have a gain-bandwidth product in the range of about 10 kHz to 500 kHz.

11. The chopper-stabilized amplifier of claim 9, wherein the first and second back-end amplifiers are Miller amplifiers, each having at least one respective pole in the frequency domain.

12. The chopper-stabilized amplifier of claim 1, wherein the binary clock signal has a frequency in a range of about 100 kHz to 1 MHz.

13. A magnetic field sensor, comprising:
a Hall effect element having two output nodes at which is provided a differential output signal that varies in response to a magnetic field, the Hall effect element differential output signal comprising a magnetic field signal component and an offset component; and
a chopper-stabilized amplifier, comprising:
first and second front-end amplifiers, each having a respective input node coupled to the Hall effect element and each having a respective feedback node, wherein the first front-end amplifier is configured to generate a first amplified output signal and the second front-end amplifier is configured to generate a second amplified output signal;
a first switching network coupled to receive a binary clock signal having first and second periodic states, coupled to receive the first and second amplified output signals, and configured to generate first and second switched output signals, wherein, during the first state of the binary clock signal, the first switched output signal is related to the first amplified output signal and the second switched output signal is related to the second amplified output signal, and wherein, during the second state of the binary clock signal, the first switched output signal is related to the second amplified output signal and the second switched output signal is related to the first amplified output signal;
first and second back-end amplifiers, wherein the first back-end amplifier is coupled to receive the first switched output signal and the second back-end amplifier is coupled to receive the second switched output signal, wherein the first back-end amplifier is configured to generate a first back-end output signal and the second back-end amplifier is configured to generate a second back-end output signal, wherein an output signal of the chopper-stabilized amplifier is a differential signal comprised of the first and second back-end output signals; and
at least one of a feedback circuit or a second switching network coupled to receive the first and second back-end output signals, wherein the other one of the feedback circuit or the second switching network is configured to generate first and second switched feedback signals, wherein the second switching network is coupled to receive the binary clock signal, wherein, during the first state of the binary clock signal, the first switched feedback signal is related to the first back-end output signal and the second switched feedback signal is related to the second back-end output signal, and wherein, during the second state of the binary clock signal, the first switched feedback signal is related to the second back-end output signal and the second switched feedback signal is related to the first back-end output signal, wherein the feedback node of the first front-end amplifier is coupled to receive the first switched feedback signal, and wherein the feedback node of the second front-end amplifier is coupled to receive the second switched feedback signal.

14. The magnetic field sensor of claim 13, further comprising a modulation circuit coupled between the Hall effect element and the chopper-stabilized amplifier and coupled to receive the binary clock signal, wherein the modulation circuit is operable to modulate the magnetic field signal component to provide to the first and second front-end amplifiers a modulated signal having the modulated magnetic field signal component and having an un-modulated offset component.

15. The magnetic field sensor of claim 14, wherein the modulation circuit is operable to modulate the magnetic field signal component in accordance with the frequency of the binary clock signal.

16. The magnetic field sensor of claim 14, wherein the feedback circuit comprises first, second, and third series coupled resistors.

17. The magnetic field sensor of claim 14, wherein the first and second amplified output signals are differential signals and wherein the first and second switched output signals are differential signals.

18. The magnetic field sensor of claim 14, wherein the first and second back-end output signals include a modulated offset component and a de-modulated magnetic field signal component.

19. The magnetic field sensor of claim 14, wherein the first and second front-end amplifiers have a relatively larger gain-bandwidth product, and wherein the first and second back-end amplifiers have a relatively lower gain-bandwidth product.

20. The magnetic field sensor of claim 19, wherein the first and second front-end amplifiers have a gain-bandwidth product in the range of about 100 kHz to 5 MHz.

21. The magnetic field sensor of claim 20, wherein the first and second back-end amplifiers have a gain-bandwidth product in the range of about 10 kHz to 500 kHz.

22. The magnetic field sensor of claim 19, wherein the first and second back-end amplifiers are Miller amplifiers, each having at least one respective pole in the frequency domain.

23. The magnetic field sensor of claim 14, wherein the binary clock signal has a frequency in a range of about 100 kHz to 1 MHz.

* * * * *

UNITED STATES PATENT AND TRADEMARK OFFICE
CERTIFICATE OF CORRECTION

| | |
|---|---|
| PATENT NO. | : 7,605,647 B1 |
| APPLICATION NO. | : 12/111554 |
| DATED | : October 20, 2009 |
| INVENTOR(S) | : Romero et al. |

Page 1 of 1

It is certified that error appears in the above-identified patent and that said Letters Patent is hereby corrected as shown below:

On the Title Pg Item (75), delete "Hernan D. Romero, Vte. Lopez (AR) Gerardo Monreal, Pilar (AR)" and replace with --Hernan D. Romero, Buenos Aires (AR) Gerardo Monreal, Buenos Aires (AR)--.

Col. 5, line 46, delete "filed" and replace with --field--.

Col. 6, line 59, delete "signal" and replace with --signals--.

Col. 9, line 65, delete "signals" and replace with --signal--.

Col. 10, line 1-2, delete "feedback 332b signal" and replace with --feedback signal 332b--.

Col. 10, line 4, delete "signals" and replace with --signal--.

Col. 10, line 6-7, delete "feedback 332b signal" and replace with --feedback signal 332b--.

Col. 10, line 9, delete "signals" and replace with --signal--.

Col. 10, line 11, delete "feedback 332b signal" and replace with --feedback signal 332b--.

Col. 10, line 13, delete "signals" and replace with --signal--.

Col. 10, line 20, delete "signals" and replace with --signal--.

Col. 10, line 24, delete "signals" and replace with --signal--.

Col. 11, line 36, delete "signals" and replace with --signal--.

Col. 11, line 42, delete "signals" and replace with --signal--.

Signed and Sealed this

Nineteenth Day of January, 2010

David J. Kappos
*Director of the United States Patent and Trademark Office*